US012635375B2

(12) United States Patent
Cao et al.

(10) Patent No.: US 12,635,375 B2
(45) Date of Patent: May 19, 2026

(54) PIXEL ARRANGEMENT STRUCTURE, DISPLAY PANEL AND METHOD FOR MANUFACTURING THE SAME

(71) Applicants:Chengdu BOE Optoelectronics Technology Co., Ltd., Sichuan (CN); BOE Technology Group Co., Ltd., Beijing (CN)

(72) Inventors: Xilei Cao, Beijing (CN); Dengyu Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 683 days.

(21) Appl. No.: 17/913,274

(22) PCT Filed: Oct. 22, 2021

(86) PCT No.: PCT/CN2021/125493
§ 371 (c)(1),
(2) Date: Sep. 21, 2022

(87) PCT Pub. No.: WO2022/199003
PCT Pub. Date: Sep. 29, 2022

(65) Prior Publication Data
US 2024/0237457 A1      Jul. 11, 2024

(30) Foreign Application Priority Data
Mar. 25, 2021    (CN) .......................... 202110323248.1

(51) Int. Cl.
*H10K 59/35*          (2023.01)
*H10K 59/12*          (2023.01)

(52) U.S. Cl.
CPC ....... *H10K 59/353* (2023.02); *H10K 59/1201* (2023.02)

(58) Field of Classification Search
CPC ................... H10K 59/351–353; H10K 59/121
See application file for complete search history.

(56) References Cited

U.S. PATENT DOCUMENTS

| | | | | |
|---|---|---|---|---|
| 2008/0117154 A1* | 5/2008 | Yeh | ...................... | G09G 3/3648 |
| | | | | 345/90 |
| 2012/0056531 A1* | 3/2012 | Park | ..................... | H10K 50/125 |
| | | | | 313/506 |

(Continued)

FOREIGN PATENT DOCUMENTS

| | | |
|---|---|---|
| CN | 103123927 A | 5/2013 |
| CN | 107742637 A | 2/2018 |

(Continued)

OTHER PUBLICATIONS

English Translation of JP2011058066 (Year: 2011).*

(Continued)

*Primary Examiner* — Eric K Ashbahian
(74) *Attorney, Agent, or Firm* — WHDA, LLP

(57) ABSTRACT

The present disclosure provides a pixel arrangement structure comprising repeating units composed of six pixels sequentially arranged in a first direction, wherein each pixel is composed of a first region and a second region arranged in a second direction, the first regions and the second regions of the six pixels are respectively aligned with each other in the first direction, wherein both the second regions of the first, third and fifth pixels and the first regions of the second, fourth and sixth pixels are composed of a first sub-region and a second sub-region arranged in the first direction, wherein each pixel comprises sub-pixels of three colors respectively arranged in one region and two sub-regions. In the first direction, adjacent pixels have adjacent sub-pixels (Continued)

of the same color. The present disclosure also provides a display panel comprising the pixel arrangement structure and a method for manufacturing the same.

19 Claims, 5 Drawing Sheets

(56) References Cited

U.S. PATENT DOCUMENTS

| | | |
|---|---|---|
| 2015/0364526 A1 | 12/2015 | Peng et al. |
| 2020/0075687 A1* | 3/2020 | He ........................ H10K 59/351 |
| 2020/0098840 A1* | 3/2020 | Hou ...................... H10K 59/122 |
| 2021/0359034 A1 | 11/2021 | Shi et al. |
| 2022/0319405 A1* | 10/2022 | Lee ...................... G09G 3/3208 |
| 2023/0329065 A1* | 10/2023 | Chen ..................... H10K 59/123 |
| 2024/0107845 A1* | 3/2024 | Yamazaki .......... H10K 59/1201 |

FOREIGN PATENT DOCUMENTS

| | | | |
|---|---|---|---|
| CN | 111383542 A | 7/2020 | |
| CN | 112909068 A | 6/2021 | |
| CN | 215220728 U | 12/2021 | |
| JP | 2010-165587 A | 7/2010 | |
| JP | 2011-058066 A | 3/2011 | |
| JP | 2011058066 * | 3/2011 | ............. C23C 14/04 |

OTHER PUBLICATIONS

Office Action dated Dec. 2, 2024, issued in counterpart CN Application No. 202110323248.1, with English translation. (19 pages).

* cited by examiner (a)                    (b)

(a)                              (b)

PIXEL ARRANGEMENT STRUCTURE, DISPLAY PANEL AND METHOD FOR MANUFACTURING THE SAME

CROSS REFERENCE TO RELATED APPLICATION(S)

This application is a Section 371 National Stage Application of International Application No. PCT/CN2021/125493, which claims priority to Chinese Patent Application No. 202110323248.1 filed on Mar. 25, 2021, and the contents of which are incorporated herein by reference in its entirety.

TECHNICAL FIELD

The present disclosure related to the technical field of display, and particularly to a pixel arrangement structure, a display panel and a method for manufacturing the same.

BACKGROUND

In recent years, light-emitting diode (LED) type display panels have attracted more and more attentions. Typically, in a light-emitting diode display panel, light emitting material layers for emitting different colors are provided to form sub-pixels of various colors. The light emitting material layers may be deposited with a mask, such as a fine metal mask (FMM). Light emitting materials are deposited onto a substrate through patterned mask openings to form a desired pixel arrangement structure.

With increasingly strict requirements for display effect and development of technologies, there is an increasing demand for high resolution display panels. Nevertheless, in the process of forming a display panel by deposition, the pixel resolution is limited by the mask.

SUMMARY

In an aspect, the present disclosure provides a pixel arrangement structure comprising an array composed of repeating units repeatedly arranged in a first direction and a second direction perpendicular to the first direction, wherein the repeating units are composed of first, second, third, fourth, fifth and sixth pixels sequentially arranged in the first direction, wherein each of the first to sixth pixels is composed of a first region and a second region arranged in the second direction, and the first regions and the second regions of the first to sixth pixels are respectively aligned with each other in the first direction, wherein both the second regions of the first, third and fifth pixels and the first regions of the second, fourth and sixth pixels are composed of a first sub-region and a second sub-region arranged in the first direction, wherein, in the first pixel, the first region is a sub-pixel of first color, the first sub-region of the second region is a sub-pixel of second color, and the second sub-region of the second region is a sub-pixel of third color;

in the second pixel, the first sub-region of the first region is a sub-pixel of first color, the second sub-region of the first region is a sub-pixel of second color, and the second region is a sub-pixel of third color;

in the third pixel, the first region is a sub-pixel of second color, the first sub-region of the second region is a sub-pixel of third color, and the second sub-region of the second region is a sub-pixel of first color;

in the fourth pixel, the first sub-region of the first region is a sub-pixel of second color, the second sub-region of the first region is a sub-pixel of third color, and the second region is a sub-pixel of first color;

in the fifth pixel, the first region is a sub-pixel of third color, the first sub-region of the second region is a sub-pixel of first color, and the second sub-region of the second region is a sub-pixel of second color; and in the sixth pixel, the first sub-region of the first region is a sub-pixel of third color, the second sub-region of a first region is the sub-pixel of first color, and the second region is a sub-pixel of second color.

Optionally, the pixel arrangement structure has a resolution of 250 ppi or more.

Optionally, in the first direction, a distance between adjacent pixels is in a range from 10 to 35 μm.

Optionally, in the second direction, a smallest distance between sub-pixels of the same color in different regions is in a range from 10 to 35 μm.

Optionally, in at least one pixel, the first region has a light emitting area different from that of the second region, or the first sub-region has a light emitting area different from that of the second sub-region.

Optionally, the first color, the second color and the third color are red, green and blue respectively, in the first regions of the first, third and fifth pixels and the second regions of the second, fourth and sixth pixels, an area of the sub-pixel of blue color>an area of the sub-pixel of red color>an area of the sub-pixel of green color, and in the first and second sub-regions of the first to sixth pixels, an area of the sub-pixel of blue color>an area of the sub-pixel of red color>an area of the sub-pixel of green color.

Optionally, sub-pixels of the same color have the same length in the second direction.

Optionally, at least two sub-pixels of different colors have different lengths in the second direction.

In another aspect, the present disclosure provides a display panel comprising the pixel arrangement structure as described above, sub-pixels of the display panel comprise opposite pixel electrodes, and a light emitting material layer and a pixel defining layer between the pixel electrodes, wherein in a first direction, adjacent sub-pixels of the same color have a continuous light emitting material layer.

Optionally, pixels in a display area have a total aperture ratio of 20% or more.

Optionally, the sub-pixels are defined by a region overlapped by the pixel electrodes and the light emitting material layer within a region defined by the pixel defining layer.

Optionally, in the repeating units, driving units for the sub-pixels of first color are arranged along a first column in the first direction, driving units for the sub-pixels of second color are arranged along a second column in the first direction, and driving units for the sub-pixels of third color are arranged along a third column in the first direction, wherein the first column, the second column and the third column are staggered in the second direction.

Optionally, the display panel is an organic light-emitting diode display panel or a quantum dot light-emitting diode display panel.

Optionally, the display panel is a sub-millimeter light-emitting diode display panel or a micrometer light-emitting diode display panel.

In yet another aspect, the present disclosure provides a display device comprising the display panel as described above.

In yet another aspect, the present disclosure provides a method for manufacturing the display panel as described above, comprising depositing continuous light emitting material layers for the same color through a mask with staggered openings.

Optionally, light emitting material layers for different colors are deposited through masks with different opening sizes and/or different opening intervals.

DETAILED DESCRIPTION

In a typical pixel arrangement structure, a single pixel is used as a repeating unit. The pixels as repeating units are repeatedly arranged in a first direction and a second direction which are perpendicular to each other to form an array. Each pixel comprises sub-pixels of three colors, such as red, green and blue (R, G, B) sub-pixels. In the first direction, the sub-pixels of one color are repeatedly arranged. In the second direction, the sub-pixels of three colors are arranged in turns.

Figure 1:
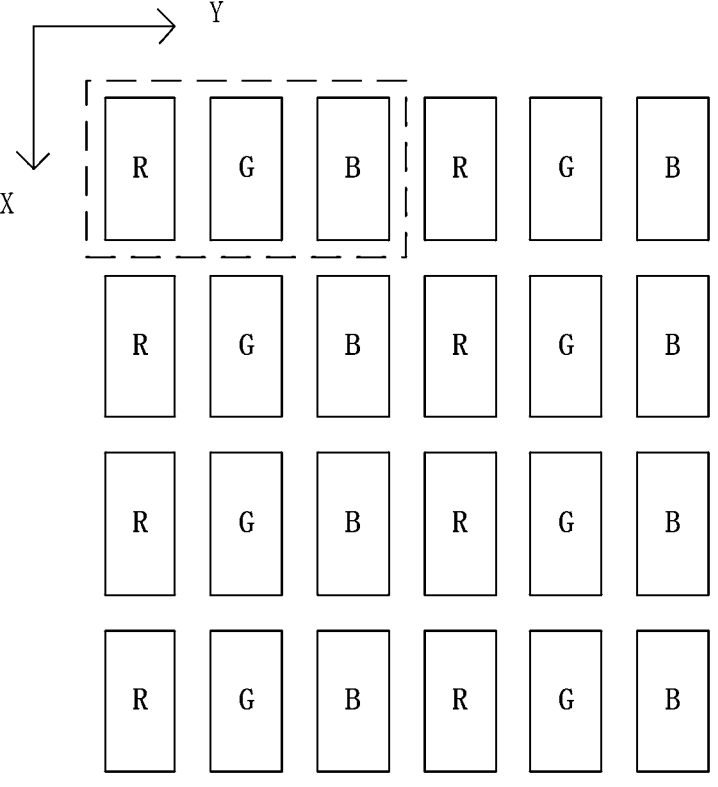
FIG. 1 shows a conventional RGB pixel arrangement structure.

FIG. 1 shows such a conventional RGB pixel arrangement structure. The dot line box at the top left of the figure indicates one repeating unit of the pixel arrangement, which is one pixel. The pixels are repeatedly arranged in the first direction X and the second direction. FIG. 1 shows 4×2 of pixels. Each pixel comprises one R sub-pixel, one G sub-pixel and one B sub-pixel. In the X direction, the sub-pixels of one color are repeatedly arranged. In the Y direction, the R, G and B sub-pixels are arranged in turns.

In the present disclosure, ordinal numbers "first", "second" and the like are only used for the need to distinguish between different features with the same name, but not for any other limitation on the features.

In the present disclosure, for convenience, the first direction and the second direction are sometimes also referred to as the column direction and the row direction, or sometimes referred to as the X direction and the Y direction respectively. It should be understood that this is only for the purpose of convenient description. X and Y or column and row may be interchanged, which will not materially affect the technical solution.

In a light-emitting diode type display panel, opposite pixel electrodes, and a light emitting material layer as well as optional carrier injection layers, carrier transport layers and the like therebetween form a diode structure, and carriers are provided from the pixel electrodes to the light emitting material layer to achieve the luminescence of the pixel. For the design of the pixel arrangement structure as shown in FIG. 1, a light emitting material layer may be deposited to each sub-pixel region through a mask. In that case, the size of the sub-pixels is limited by the precision of the mask. Portions between openings in the mask will block the deposition path of the organic material layer, such that there is spacing between the organic material layers deposited through different openings. Because there is no light emitting material in the spacing regions, light emitting in these regions is impossible. Therefore, in order to increase the resolution, it is necessary to reduce the spacing between the light emitting material layers of adjacent sub-pixels of the same color in the X direction as much as possible. This requires that the corresponding blocking portion of the mask also becomes narrower. However, because the mask has a size limitation due to the material property and the manufacture process and cannot be made narrow as desired, it is difficult to further increase the resolution. Currently, it is very difficult for the resolution to exceed 300 ppi.

In order to overcome the problem that no light emitting material can be deposited at the blocking portion between the mask openings, it may be considered to design the mask such that one opening corresponds to a column of sub-pixels. That is, a continuous large-area strip of light emitting material layer is deposited to form a plurality of sub-pixels. In that case, the actual light emitting regions of the sub-pixels may be separated from each other by providing a pixel defining layer between the sub-pixels or the like. For example, a convex pixel defining layer is formed between the sub-pixels in advance, and then a light emitting material layer covering all sub-pixels in a column is formed, so as to confine the light emitting region of each sub-pixel within the region enclosed by the pixel defining layer. Nevertheless, forming the whole column of sub-pixels through a single mask opening requires a too high level for the mask, and is substantively impossible to be used to form a large-area display panel. Furthermore, it is also difficult for such a solution to avoid the lateral cross talk of carriers in the light emitting material layer. One sub-pixel may influence the light emitting material layer in a range of several sub-pixels around it when it lights up, thereby affecting the display quality.

The present disclosure proposes a new pixel arrangement structure to optimize the pixel arrangement, which at least partially solves the above problem of resolution limited by the mask. The pixel arrangement structure of the present disclosure may achieve excellent display effect, while increasing the aperture ratio for the pixel, thereby increasing the resolution.

In an embodiment, the present disclosure provides a pixel arrangement structure comprising an array composed of repeating units repeatedly arranged in a first direction and a second direction perpendicular to the first direction, wherein the repeating units are composed of first, second, third, fourth, fifth and sixth pixels sequentially arranged in the first direction, wherein each of the first to sixth pixels is composed of a first region and a second region arranged in the second direction, and the first regions and the second regions of the first to sixth pixels are respectively aligned with each other in the first direction, wherein both the second regions of the first, third and fifth pixels and the first regions of the second, fourth and sixth pixels are composed of a first sub-region and a second sub-region arranged in the first direction, wherein, in the first pixel, the first region is a sub-pixel of first color, the first sub-region of the second region is a sub-pixel of second color, and the second sub-region of the second region is a sub-pixel of third color;

in the second pixel, the first sub-region of the first region is a sub-pixel of first color, the second sub-region of the first region is a sub-pixel of second color, and the second region is a sub-pixel of third color;

in the third pixel, the first region is a sub-pixel of second color, the first sub-region of the second region is a sub-pixel of third color, and the second sub-region of the second region is a sub-pixel of first color;

in the fourth pixel, the first sub-region of the first region is a sub-pixel of second color, the second sub-region of the first region is a sub-pixel of third color, and the second region is a sub-pixel of first color;

in the fifth pixel, the first region is a sub-pixel of third color, the first sub-region of the second region is a sub-pixel of first color, and the second sub-region of the second region is a sub-pixel of second color; and in the sixth pixel, the first sub-region of the first region is a sub-pixel of third color, the second sub-region of a first region is the sub-pixel of first color, and the second region is a sub-pixel of second color.

Figure 2:
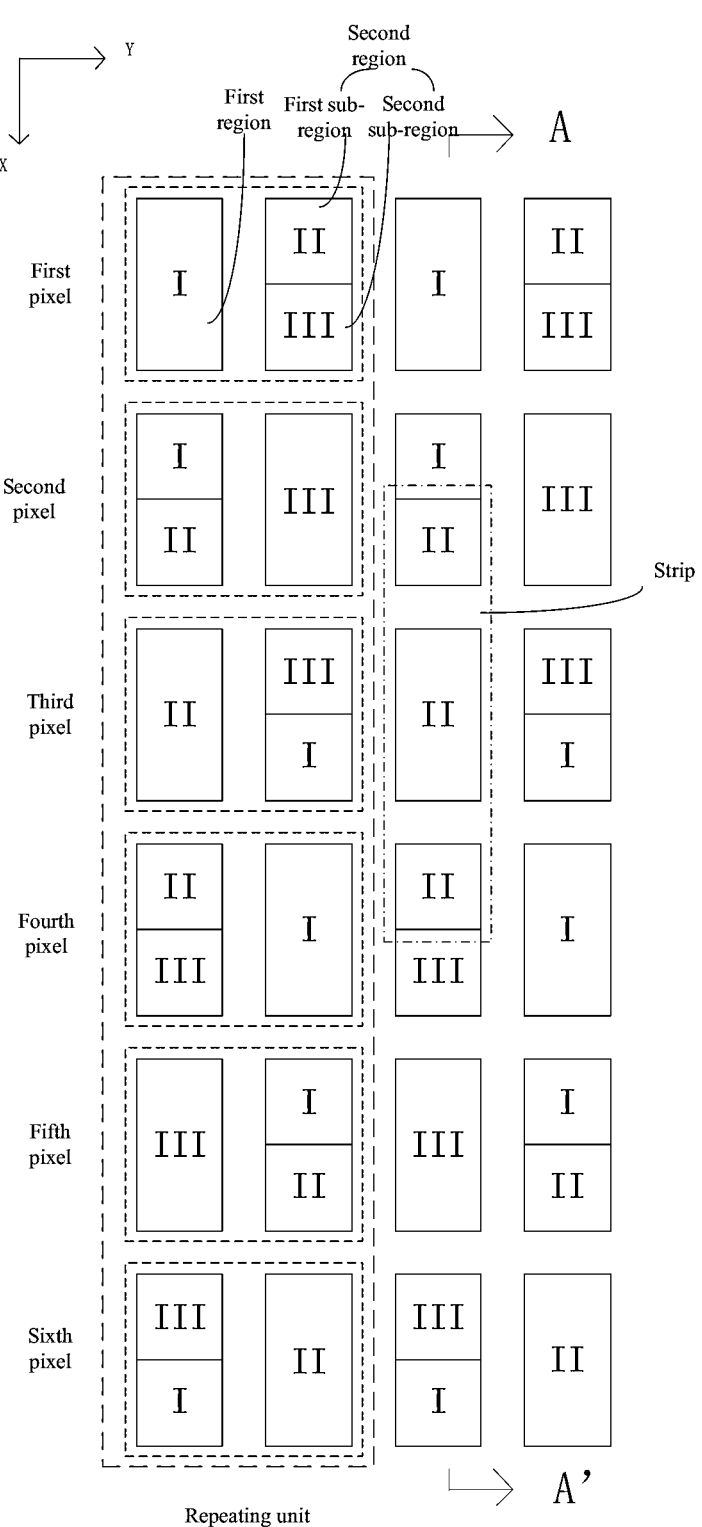
FIG. 2 shows an RGB pixel arrangement structure according to an embodiment of the present disclosure.

FIG. 2 shows an RGB pixel arrangement structure according to an embodiment of the present disclosure. In FIG. 2, the first direction is represented by the X direction, i.e., the downward column direction; and the second direction is represented by the Y direction, i.e., the rightward row direction.

FIG. 2 shows two repeating units arranged in the Y direction. It may be understood that the repeating units are repeatedly arranged in both the row direction and the column direction within a display plane to form an array, thereby achieving the display.

A large dot line box on the left of FIG. 2 indicates one repeating unit which is composed of first, second, third, fourth, fifth and sixth pixels sequentially arranged in the first direction.

As shown in FIG. 2, in one repeating unit, from top to bottom are the first to sixth pixels, each indicated with a smaller dot line box.

Each pixel is composed of a first region and a second region arranged in the Y direction. The first regions and the second regions of the first to sixth pixels are respectively aligned with each other in the X direction, wherein all the second regions of the first, third and fifth pixels and the first regions of the second, fourth and sixth pixels are composed of a first sub-region and a second sub-region arranged in the X direction.

The first pixel as shown in FIG. 2 comprises a first region on the left and a second region on the right. Likewise, all the second to sixth pixels also have a first region on the left and a second region on the right. All first regions are aligned with each other in the X direction, and all the second regions are also aligned with each other in the X direction.

Specifically, all the second regions of the first, third and fifth pixels and the first regions of the second, fourth and sixth pixels are composed of two sub-regions. As such, each pixel have a monolithic region and a combination region of two sub-regions. The monolithic region and the combination region are arranged in turns.

In the present disclosure, the expression "staggered arrangement" means that between two elements in the first direction, there is an element of the same type which is translated in the second direction. For example, between the monolithic regions of the first pixel and the third pixel (i.e., the first region of the first pixel and the first region of the third pixel), there is a monolithic region (i.e., the second region of the second pixel) which is translated in the second direction.

In the present disclosure, each pixel comprises sub-pixels of three colors, i.e., a sub-pixel of first color, a sub-pixel of second color and a sub-pixel of third color. The pixel having all the sub-pixels of three colors may meet the requirement for true color display. The examples of the sub-pixels of three colors include RGB sub-pixels. Nevertheless, among the first to sixth pixels, the specific forms and arrangements of the sub-pixels are different.

In the first pixel, the first region is a sub-pixel of first color. In FIG. 2, the sub-pixel of first color is represented by I, and this sub-pixel of first color occupies the first region on the left. Furthermore, the first sub-region of the second region is a sub-pixel of second color, which is represented by II, and the second sub-region thereof is a sub-pixel of third color, which is represented by III. The sub-pixel of second color and the sub-pixel of third color each occupy only one sub-region. In the present disclosure, the sub-pixel occupying one region is sometimes referred to as a large sub-pixel, while the sub-pixel only occupying one sub-region and forming one region together with another sub-pixel of another color is sometimes referred to as a small sub-pixel. As such, in the first pixel, the large sub-pixel of first color is on the left, while the small sub-pixel of second color and the small sub-pixel of third color are on the right.

The sub-pixel configuration in the second pixel below the first pixel is different from that in the first pixel. It is composed of a large sub-pixel of third color on the right and small sub-pixels of first and second colors on the left. The rule for the relationship between the second pixel and the first pixel is that: a large sub-pixel of the same color (i.e., the third color in FIG. 2) is provided below the small sub-pixel of the pixel above (i.e., the first pixel), and a small sub-pixel of the same color (i.e., the first color in FIG. 2) is provided below the large sub-pixel above, and further, a small sub-pixel of color other than the above two colors (i.e., the second color in FIG. 2) is provided in the sub-region below that small sub-pixel.

The pixels below are configured according to the same rule. In the third pixel, a large sub-pixel of second color is provided below the small sub-pixel of second color of the second pixel, and a small sub-pixel of third color is provided below the large sub-pixel of third color of the second pixel, and further, a small sub-pixel of first color is provided in the sub-region below that small sub-pixel.

One repeating unit is formed after the fourth, fifth and sixth pixels are sequentially provided. The next pixel in the X direction will be the same as the first pixel. Thus, each pixel comprises sub-pixels of three colors respectively arranged in one region and two sub-regions. In the first direction, adjacent pixels have adjacent sub-pixels of the same color.

In the pixel arrangement structure of the present disclosure, each pixel comprises sub-pixel of three colors. As compared to some design schemes where a sub-pixel color is omitted in the pixel or sub-pixel and data line are shared among pixels, in the scheme of the present disclosure, the sub-pixels of various colors exhibit true color display (Real RGB) and good display effect. Although the large sub-pixel and small sub-pixel in each pixel have different areas, in practical use, an independent driving unit may be adjusted to control the luminous intensity for each sub-pixel, thereby solving the problem of different sub-pixel areas.

The features of the pixel arrangement structure of the present disclosure will be further described as follows. Small sub-pixels of the same color are on two ends of and aligned with each large sub-pixel, and form a "strip" in the first direction together with this large sub-pixel. As such, the light emitting material layer in the large sub-pixel and the small sub-pixels on two ends thereof may be formed through the same mask opening. Each strip is surrounded by strips of other colors.

In FIG. 2, the dot and dash line box indicates a strip of second color in the repeating unit on the right. The strip comprises a large sub-pixel in the middle and small sub-pixels above and below the large sub-pixel, which belong to the third, second and fourth pixels respectively. All the sub-pixels around this strip are not of the second color. There is a sufficient distance between each strip and a strip of the same color nearby, which is advantageous for deposition of the light emitting material through a mask.

FIG. 2 is merely a schematic diagram of a pixel arrangement structure. In the figure, two small sub-pixels in the same region are drawn to be closely adjacent to each other. Nevertheless, there may be a gap between them.

Figure 3:
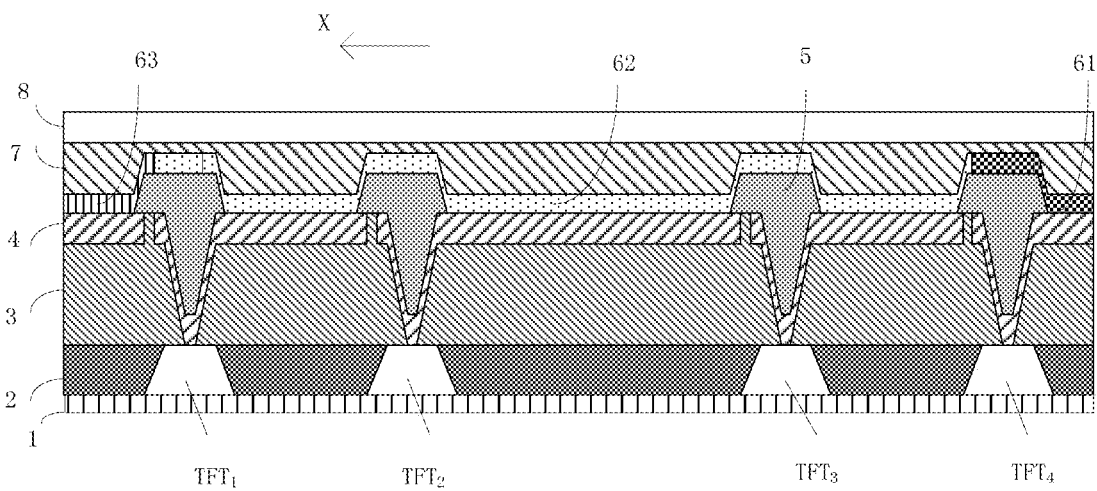
FIG. 3 shows a section view of a pixel arrangement structure according to an embodiment of the present disclosure.

The light emitting material in one strip of the present disclosure is continuously deposited. Therefore, in order to divide it into three pixels, it is necessary to configure the pixel electrode structure. FIG. 3 shows a section view of a pixel arrangement structure according to an embodiment of the present disclosure.

FIG. 3 shows a schematic section view of the indicated strip of second color taken along A-A' in an embodiment of a display panel comprising the pixel arrangement structure as shown in FIG. 2. The X direction is indicated in the figure. That is, the right side of FIG. 3 corresponds to the upper side of FIG. 2, and the left side corresponds to the lower side of FIG. 2.

As shown in FIG. 3, the pixel arrangement structure is formed on a TFT substrate. The TFT substrate is simply and schematically shown in FIG. 3, which comprises, for example, a bottom layer 1, a thin film transistor TFT, and another film layer 2, and may have a conventional structure. The figure shows 4 TFTs, wherein $TFT_1$ is a TFT used for the small sub-pixel of second color in the first region of the fourth pixel in the strip of FIG. 2, $TFT_2$ is a TFT used for the large sub-pixel of second color in the first region of the third pixel, $TFT_3$ is a TFT used for the small sub-pixel of second color in the first region of the second pixel, and $TFT_4$ is a TFT used for the small sub-pixel of first color in the first region of the second pixel. Here, the details of the TFT are not shown, and the TFT may conventionally comprise source/drain electrodes, a gate electrode, a semiconductor layer, and so on. Furthermore, the bottom layer may comprise a base layer, a buffer layer, a reflecting layer, and so on, and other film layers may comprise an interlayer dielectric layer, an insulating layer, and so on.

A planarization layer 3 may be formed on the TFT substrate, and an anode 4 passes through a via hole in the planarization layer and is connected to the drain electrode of the TFT. The figure depicts 5 anodes, which are used as the pixel electrodes in the first regions of the second pixel, the third pixel and the fourth pixel in FIG. 2 respectively.

A pixel defining layer 5 is formed after forming the anodes 4. The pixel defining layer is formed from an insulating material to define the ranges for the sub-pixels. Subsequently, light emitting material layers of first color, second color and third color, 61, 62, 63, may be deposited respectively through a mask. Next, a common cathode 7 and an encapsulating structure 8 such as a cover plate are formed.

It should be understood that carrier injection layer(s)/carrier transport layer(s) and so on may be further formed before or after forming the light emitting material layer. For simplicity, those conventional film layers are not shown in FIG. 3. It should also be understood that the display panel may further comprise a conventional structure such as a color film layer, a black matrix and a protection layer. For simplicity, those conventional structures are not shown in FIG. 3, either.

The pixel arrangement structure of the present disclosure may allow one large sub-pixel and small sub-pixels on two ends thereof, which have the same color as it and aligned with it, to share a continuous light emitting material layer. As in FIG. 3, the light emitting material layer of second color 62 is used for $TFT_1$, $TFT_2$ and $TFT_3$ at the same time. Although the light emitting material layer is continuous, the light emitting material layer at the pixel defining layer will not emit light due to the presence of the pixel defining layer. Furthermore, the cross talk between the sub-pixels of the same color is only confined within this strip, and will not go beyond the range of this strip. For example, other sub-pixels of second color in FIG. 2 are completely separated from this strip, and will not be influenced thereby. Therefore, high display quality may be guaranteed.

It should be understood that the connection between the driving units and the pixel electrodes as shown in FIG. 3 is only schematic. The TFT driving electrodes may not be located right below the anodes of the pixels, but may be located at any appropriate position and connected to the anodes of the pixels by a conductor.

The light emitting material layers of the pixel arrangement structure of the present disclosure are distributed in the form of strips, which is particularly advantageous for the process of depositing a light emitting material layer with a mask. The reason is that the mask for forming the pixel arrangement structure of the present disclosure has several obvious advantages over the mask for a conventional pixel arrangement structure.

FIG. 4(a) schematically shows partial opening shapes of a mask for forming the light emitting layers in the form of strip of second color in FIG. 2. In contrast, FIG. 4(b) shows a mask having strip-like openings for preparing the structure in FIG. 1.

As can be seen, in FIG. 4(b), because of the limitations of the material of the mask and the precision of the preparing process, spacing must be kept between two openings for depositing the light emitting material of the same color in the vertical direction. Within this spacing, no light emitting material can be deposited, and therefore the pixel resolution is limited. If the openings of the mask are designed to prevent the presence of such spacing by traversing across the entire display area, it is unacceptable from the viewpoint of the mechanical strength of the mask. In contrast, in the mask suitable for the pixel arrangement structure of the present disclosure as shown in FIG. 4(a), the spacing between the sub-pixels will not be influenced by such spacing between the openings of the mask. Therefore, in the case of the same mask process level, the pixel arrangement of the present disclosure will not result in that large spacing must be kept between the sub-pixels, thereby achieving a higher resolution.

In addition, the staggered mask opening design of the present disclosure may also prevent the "mask wrinkle". Because the mask openings in FIG. 4(b) are a plurality of vertical columns in parallel, the strength of the mask in the direction perpendicular to the vertical columns will be influenced. In the mask as shown in FIG. 4(b), regions with fluctuated strengths obviously form in the horizontal direction, and wrinkles will easily form when the mask is pressed. The longer the openings, or the smaller the spacing between the openings in the vertical direction, the more obvious the effect is. Therefore, not only for a large-area display panel, but also for a small-area display panel, the risk of wrinkle will result in that the opening length must be limited, such that there has to be a relatively large space between the openings, which influences the resolution. In contrast, the pixel arrangement structure of the present disclosure in FIG. 4(a) allows the mask openings being not continuous in the vertical direction and also being arranged separately in the horizontal direction, which greatly increases the strength of the mask in the horizontal direction and prevents the occurrence of wrinkle. Thus, the requirements on the process level of the mask are also reduced, and it is possible to greatly simplify the process and reduce the cost.

As described above, in the present disclosure, a light emitting material strip of one color may be shared by three adjacent pixels by designing the pixel arrangement structure. Each pixel still has sub-pixels of three colors, and exhibits Real RGB true color display. When the light emitting material strip is formed by depositing with a mask, a higher resolution may be achieved under the same mask precision, or the requirements on the mask precision may be reduced for the same resolution. The light emitting material strip may confine the lateral cross talk within a range of only three sub-pixels, guaranteeing the display quality.

In an embodiment, the pixel arrangement structure may have a resolution of 250 ppi or more, preferably 320 ppi or more, more preferably 400 ppi or more, and preferably up to 600 ppi. The pixel arrangement structure of the present disclosure may have a resolution much greater than 300 ppi. Particular resolution is not only related to the sizes of the light emitting materials of the same color deposited with the mask, but also may be adjusted through the wall width of the pixel defining layer (the PDL gap), particular process parameters and so on.

In an embodiment, in the first direction, a distance between adjacent pixels is in a range from 10 to 35 μm. In other words, the spacing between the large sub-pixel and the small sub-pixel of the same color of adjacent pixels may be reduced to be within such a range. In contrast, in the pixel arrangement scheme in FIG. 1, it is difficult for the spacing between the sub-pixels of the same color of adjacent pixels to be so small.

In an embodiment, in the second direction, a smallest distance between sub-pixels of the same color in different regions is in a range from 10 to 35 μm. Because staggered arrangement is used in the pixel arrangement structure of the present disclosure, there is a sufficient distance between sub-pixels of the same color in different regions in the first direction, such that the distance therebetween in the second direction may be smaller. For example, as shown in FIG. 2, because the sub-pixel of second color in the first region of the second pixel and the sub-pixel of third color in the second region of the third pixel are further arranged below the sub-pixel of first color in the first region of the second pixel and above the sub-pixel of first color in the second region of the third pixel in the first direction, there is a sufficiently large spacing between those two sub-pixels of first color in the first direction. In such case, even if the spacing between the first region and the second region is very small, the two sub-pixels of first color will not influence each other, and no high level mask is needed. In contrast, when the RGB pixel repeating unit similar to FIG. 1 is used for example, even if it is attempted to avoid continuous arrangement of the sub-pixels of the same color in the first direction by translating the sub-pixels of three colors sequentially, the sub-pixels of the same color cannot be sufficiently separated from each other in the diagonal direction, and thus a high level mask is still needed.

In the pixel arrangement structure as shown in FIG. 2, the first region and the second region may have equal size, and the first sub-region and the second sub-region may also have equal size. In this case, the same mask may be used for evaporation deposition of light emitting materials of three colors, and it is not necessary to provide an individual mask for each color, thereby simplifying the process and reducing the cost.

However, in order to further improve the display quality, it is also possible to appropriately adjust the areas of the first region, the second region, the first sub-region, and the second sub-region as needed. Preferably, in at least one pixel, the first region has a light emitting area different from that of the second region, or the first sub-region has a light emitting area different from that of the second sub-region. More preferably, the light emitting areas may be particularly configured for eighteen sub-pixels of six pixels.

Conventionally, three colors of red, green and blue are used for the sub-pixels of three colors to achieve the color display. In state of art, RGB light emitting materials have different light emitting capacities, where typically, the blue light emitting material has a weak light emitting capacity while the green light emitting material has the strongest light emitting capacity. In this case, in an embodiment, the first color, the second color and the third color are red, green and blue respectively, and in the first regions of the first, third and fifth pixels and the second regions of the second, fourth and sixth pixels, an area of the sub-pixel of blue color>an area of the sub-pixel of red color>an area of the sub-pixel of green color, and in the first and second sub-regions of the first to sixth pixels, an area of the sub-pixel of blue color>an area of the sub-pixel of red color>an area of the sub-pixel of green color. In other words, for the sub-pixels of the same type in a repeating unit, the areas of the sub-pixels of blue color are always set to be the largest, the areas of the sub-pixels of green color are always set to be the smallest, and the areas of the sub-pixels of red color are always intermediate. Setting different areas of the sub-pixels contributes to increasing the display uniformity.

Accordingly, a mask with a relatively large opening may be used for the blue light emitting material, and a mask with a relatively small opening may be selected for the green light emitting material.

In an embodiment, in a repeating unit, sub-pixels of the same color have the same length in the second direction. Stated differently, a large sub-pixel has the same "width" as small sub-pixels of the same color at its two sides. This is advantageous for forming a light emitting material strip with constant width through a mask with a rectangular opening. Of course, the sub-pixels of the same color may be designed to have different widths. However, it may demand for a higher level of the mask opening processing.

In an embodiment, in a repeating unit, sub-pixels of different colors have different lengths in the second direction. For example, in a structure similar to the pixel arrangement structure as shown in FIG. 2, the sub-pixels of first, second and third colors of the first region in the first, third and fifth pixels may have different lengths. Thus, it is achieved that the sub-pixels of different colors have different areas.

Preferably, the openings are only different in the first direction, but the same in the second direction. That is, the sub-pixels have the same width, but have different lengths. As such, the areas of the sub-pixels are adjusted only through the lengths in the first direction.

FIG. 5(a) shows an embodiment where the RGB strips have different lengths. As can be seen, the final display areas of each region and each sub-region of a pixel may be adjusted through the pixel defining layer. FIG. 5(b) shows the sizes of the openings of the masks for depositing blue, red and green light emitting material layers from left to right when using for forming the pixel arrangement structure of FIG. 5(a). That is, the blue strip may be deposited through the mask having the longest opening, and the green strip may be deposited through the mask having the shortest opening. Accordingly, in the sub-pixel of the same type, the sub-pixel of blue color is the longest, and the sub-pixel of green color is the shortest. Nevertheless, all the sub-pixels have the same width.

Because particular sub-pixel arrangements are different among the six pixels in a repeating unit of the present disclosure, for better display quality, when practically driving the six pixels, the sub-pixel arrangements should be taken into account. For example, in order to allow each pixel to emit white light of the same intensity in the embodiment as shown in FIG. 2, the driving parameter may be appropriately set such that the overall luminous intensity of the sub-pixel of first color in the first pixel is close to that of the sub-pixel of first color in the second pixel, although the former has an area greater than that of the latter.

As compared to the conventional pixel arrangement structure of FIG. 1, the pixel arrangement structure of the present disclosure may form a relatively high resolution display panel with a relatively low level mask, while each pixel comprises sub-pixels of three colors, achieving true color display.

The present disclosure also provides a display panel comprising the pixel arrangement structure as described above, sub-pixels of the display panel comprise opposite pixel electrodes, and a light emitting material layer and a pixel defining layer between the pixel electrodes, wherein in a first direction, adjacent sub-pixels of the same color have a continuous light emitting material layer. As described above, a relatively high resolution display panel may be formed with a relatively low level mask by forming a continuous light emitting material strip. Reference may be made to FIG. 3 for the schematic diagram.

In an embodiment, in the display panel of the present disclosure, under a conventional processing condition where the wall width of the pixel defining layer is 22 μm, the total aperture ratio of the pixels in the display area may be 20% or more, preferably 22% or more, and more preferably 24% or more. In contrast, under the same process level, the display panel with the pixel arrangement structure of FIG. 1 has a total aperture ratio of up to about 15%.

In the display panel, the light emitting areas of the sub-pixels are determined by the pixel structure. Specifically, in an embodiment of the present disclosure, the sub-pixels are defined by a region overlapped by the pixel electrodes and the light emitting material layer within a region defined by the pixel defining layer. The light emitting material layer limits the possible maximum light emitting area. No light will be emitted at a position without light emitting material layer. Nevertheless, the real light emitting area will also be limited by the pixel electrodes and the pixel defining layer. Carriers may be sufficiently provided for luminescence only at the portion where the pixel electrodes is overlapped with the light emitting material layer, i.e., the portion where the pixel anode, the pixel cathode, and the light emitting material layer overlap. Here, at the pixel defining layer, the pixel anode cannot provide carriers to the light emitting material layer, and thus no light will be emitted. The desired pixel arrangement may be obtained by appropriately designing and adjusting the sizes of the pixel electrodes, the pixel defining layer and the light emitting material layer.

In the present disclosure, the sub-pixel arrangement in the repeating unit is not uniform in area, so each sub-pixel needs a separate driving unit. In an embodiment, in the repeating units, driving units for the sub-pixels of first color are arranged along a first column in the first direction, driving units for the sub-pixels of second color are arranged along a second column in the first direction, and driving units for the sub-pixels of third color are arranged along a third column in the first direction, wherein the first column, the second column and the third column are staggered in the second direction.

Figure 6:
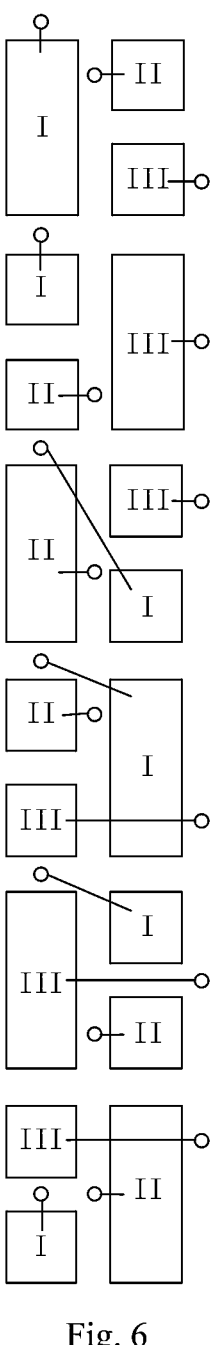
FIG. 6 shows arrangement positions of driving units in an embodiment.

In other words, the driving units (for example, TFTs) for the sub-pixels are not arranged at positions corresponding to the sub-pixels, but arranged in columns according to the colors. FIG. 6 shows an arrangement of driving units which may be used in the embodiment as shown in FIG. 2. Here, the circle positions indicate approximate positions of the driving units for respective sub-pixels in a top view. The driving units may be disposed in the TFT substrate under the pixel anodes.

Thus, the driving units for the sub-pixels of the same color are arranged in the first direction to form a column, and the columns are arranged in turns in the second direction and the driving units in different columns are staggered from each other. The driving units are connected to the anodes of the sub-pixels through wires. Such a layout facilitates the wiring of the data line and providing data signals to the driving units.

The pixel arrangement structure of the present disclosure is typically suitable for any form of display panel, because it may achieve Real RGB true color display. The pixel arrangement structure of the present disclosure is particularly suitable for forming a display panel where a light emitting material layer is formed through a mask during formation of the pixel arrangement structure. In an embodiment, the display panel of the present disclosure may be an organic light-emitting diode (OLED) display panel. In another embodiment, the display panel of the present disclosure may also be a quantum dot light-emitting diode (QLED) display panel. The above types of display panels are particularly suitable for deposition and preparation of a light emitting material layer through a mask. Furthermore, the display panel of the present disclosure may achieve a high resolution, and may be a sub-millimeter light-emitting diode (mini LED) display panel or a micrometer light-emitting diode (micro LED) display panel.

The present disclosure also provides a display device comprising the display panel as described above. Such a display device has the same advantages as the pixel arrangement structure and the display panel as described above, which will not be reiterated here.

The present disclosure also provides a method for manufacturing the display panel as described above, comprising depositing continuous light emitting material layers for the same color through a mask with staggered openings. The staggered openings correspond to the strip of continuous light emitting material layer of the same color. The staggered openings result in that a higher resolution may be achieved at the same mask process level.

When the sub-pixels of three colors have the same size in the pixel arrangement structure as shown in FIG. 2, the light emitting material layers for different colors may be prepared through the same mask. Nevertheless, when the pixel is designed such that the sub-pixels of three colors have different sizes, the light emitting material layers for different colors may be deposited through masks with different opening sizes and/or different opening intervals. That is, for each of the sub-pixels of three colors, a mask is designed and prepared individually. FIG. 5(*b*) schematically shows that the openings designed for different colors have different lengths. Such openings may be disposed in a mask having the structure as shown in FIG. 4(*a*).

Comparative Example

Figure 4:
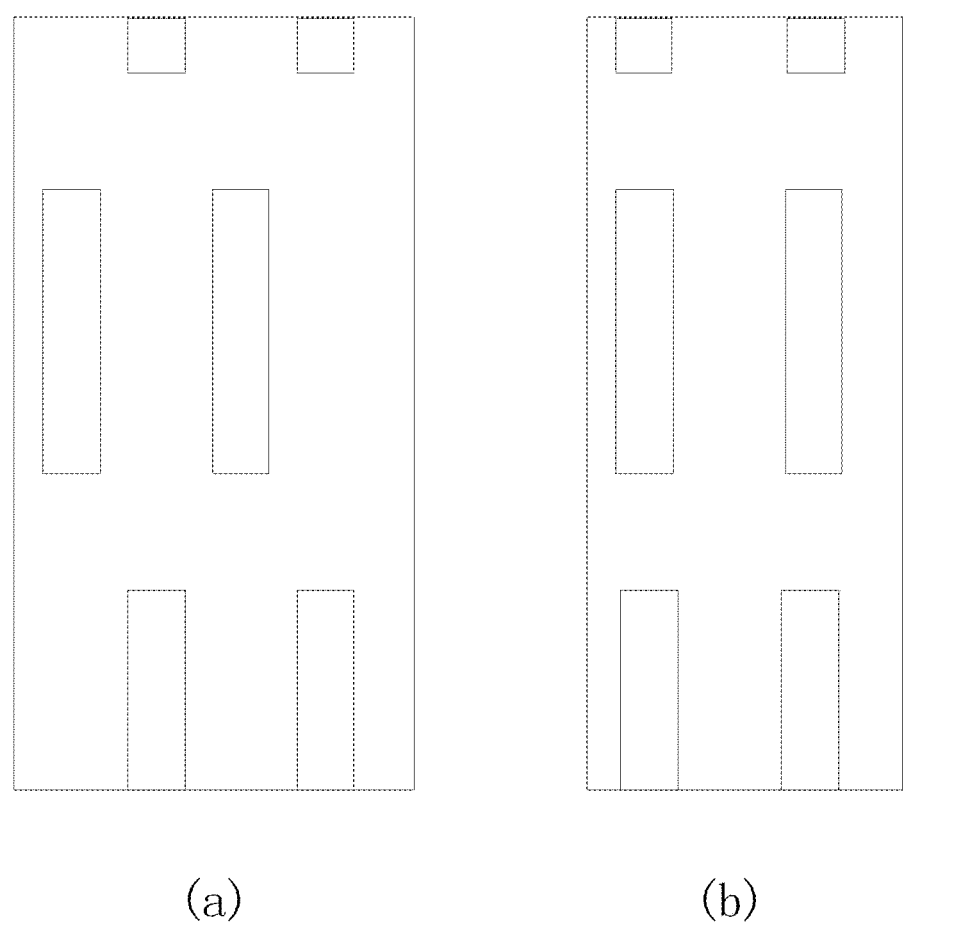
FIGS. 4(*a*) and (*b*) show a mask used in the present disclosure and an existing mask.
Figure 5:
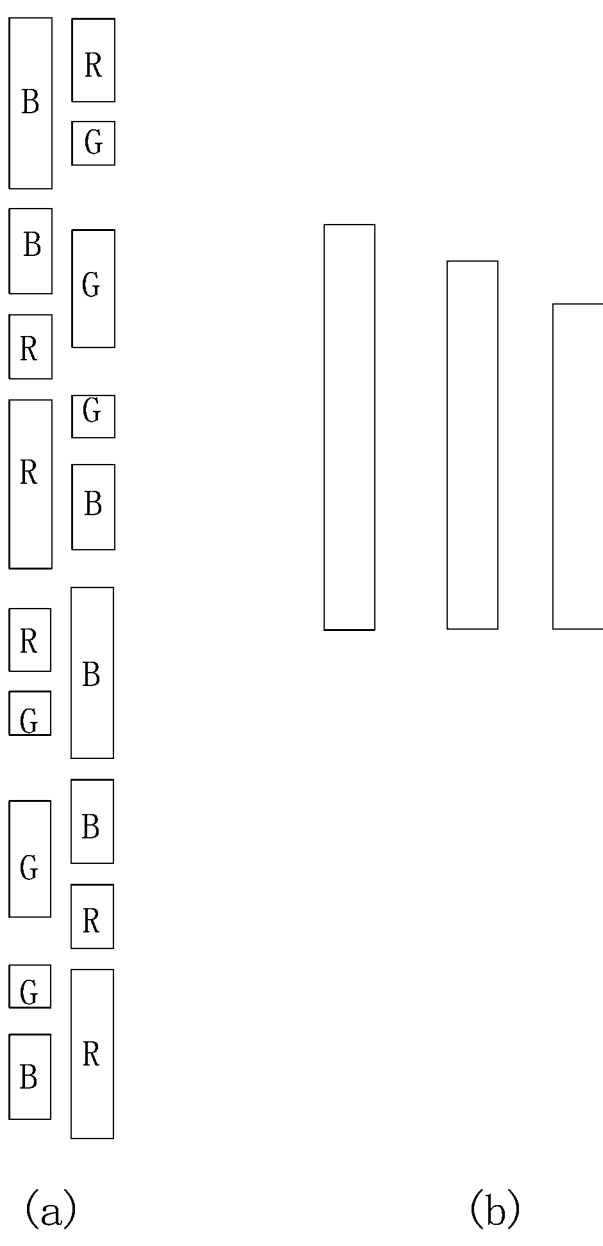
FIGS. 5(*a*) and (*b*) show an RGB pixel arrangement structure according to an embodiment of the present disclosure and a schematic diagram of mask openings as used.

A light emitting material strip of the pixel arrangement structure of FIG. 1 was deposited through the mask of FIG. 4(*b*). When the wall width of the pixel defining layer was about 22 μm, the pixel in the pixel arrangement structure as shown in FIG. 1 formed through the mask of FIG. 4(*b*), which was prepared by an existing mask level, had a total pixel aperture ratio of about 15%, and the area ratio of blue:green:red was about 2.2:1.4:1. The finally obtained display panel had a resolution of about 216 ppi.

Example 1

Under the same mask preparation and application process level as the Comparative Example, a light emitting material strip of the pixel arrangement structure of FIG. 2 was deposited through the mask of FIG. 4(*a*). When the wall width of the pixel defining layer was about 22 μm, the pixel in the pixel arrangement structure as shown in FIG. 2 formed through the mask of FIG. 4(*a*), which was prepared by an existing mask level, had a total pixel aperture ratio up to about 23%, which was about 1.5 times higher than that of the Comparative Example. The finally obtained display panel had a resolution of about 326 ppi.

Each sub-pixel was driven by an active matrix with a Real RGB display algorithm. It is not necessary to share a data line or share a sub-pixel between the pixels of the display panel of the present disclosure. After powering on, a uniform color display was achieved.

Example 2

The same process as Example 1 was used with the wall width of the pixel defining layer further reduced, and the resolution was up to 400 ppi.

Thus, by using the embodiments of the present disclosure, a display panel having a high resolution may be manufactured, and a true color display may be achieved.

The above descriptions are only particular embodiments of the present disclosure, but the protection scope of the present disclosure is not limited thereto. Within the technical scope disclosed in the present disclosure, one skilled in the art can readily envisage variations and alternatives, and all of them are covered by the protection scope of the present disclosure. Therefore, the protection scope of the present disclosure should be defined by the appended claims.

What is claimed is:

1. A pixel arrangement structure comprising an array composed of repeating units repeatedly arranged in a first direction and a second direction perpendicular to the first direction, wherein the repeating units are composed of first, second, third, fourth, fifth and sixth pixels sequentially arranged in the first direction, wherein each of the first to sixth pixels is composed of a first region and a second region arranged in the second direction, and the first regions and the second regions of the first to sixth pixels are respectively aligned with each other in the first direction, wherein both the second regions of the first, third and fifth pixels and the first regions of the second, fourth and sixth pixels are composed of a first sub-region and a second sub-region arranged in the first direction, wherein, in the first pixel, the first region is a sub-pixel of first color, the first sub-region of the second region is a sub-pixel of second color, and the second sub-region of the second region is a sub-pixel of third color;

in the second pixel, the first sub-region of the first region is a sub-pixel of first color, the second sub-region of the first region is a sub-pixel of second color, and the second region is a sub-pixel of third color;

in the third pixel, the first region is a sub-pixel of second color, the first sub-region of the second region is a sub-pixel of third color, and the second sub-region of the second region is a sub-pixel of first color;

in the fourth pixel, the first sub-region of the first region is a sub-pixel of second color, the second sub-region of the first region is a sub-pixel of third color, and the second region is a sub-pixel of first color;

in the fifth pixel, the first region is a sub-pixel of third color, the first sub-region of the second region is a sub-pixel of first color, and the second sub-region of the second region is a sub-pixel of second color; and in the sixth pixel, the first sub-region of the first region is a sub-pixel of third color, the second sub-region of a first region is the sub-pixel of first color, and the second region is a sub-pixel of second color, wherein in any three sub-pixels of an identical color arranged continuously in the first direction, the middle one is longest, and wherein in two pixels adjacent to each other in the first direction, lengths of at least one pair of sub-pixels of an identical color are different.

2. The pixel arrangement structure according to claim 1, wherein the pixel arrangement structure has a resolution of 250 ppi or more.

3. The pixel arrangement structure according to claim 1, wherein in the first direction, a distance between adjacent pixels is in a range from 10 to 35 μm.

4. The pixel arrangement structure according to claim 1, wherein in the second direction, a smallest distance between sub-pixels of the same color in different regions is in a range from 10 to 35 μm.

5. The pixel arrangement structure according to claim 1, wherein in at least one pixel, the first region has a light emitting area different from that of the second region, or the first sub-region has a light emitting area different from that of the second sub-region.

6. The pixel arrangement structure according to claim 5, wherein the first color, the second color and the third color are red, green and blue respectively, in the first regions of the first, third and fifth pixels and the second regions of the second, fourth and sixth pixels, an area of the sub-pixel of blue color>an area of the sub-pixel of red color>an area of the sub-pixel of green color, and in the first and second sub-regions of the first to sixth pixels, an area of the sub-pixel of blue color>an area of the sub-pixel of red color>an area of the sub-pixel of green color.

7. The pixel arrangement structure according to claim 1, wherein sub-pixels of the same color have the same length in the second direction.

8. A display panel comprising the pixel arrangement structure according to claim 1, sub-pixels of the display panel comprise opposite pixel electrodes, and a light emitting material layer and a pixel defining layer between the pixel electrodes, wherein in the first direction, adjacent sub-pixels of the same color have a continuous light emitting material layer.

9. The display panel according to claim 8, wherein pixels in a display area has a total aperture ratio of 20% or more.

10. The display panel according to claim 8, wherein the sub-pixels are defined by an overlapped region between the pixel electrodes and the light emitting material layer within a region defined by the pixel defining layer.

11. The display panel according to claim 8, wherein in the repeating units, driving units for the sub-pixels of first color are arranged along a first column in the first direction, driving units for the sub-pixels of second color are arranged along a second column in the first direction, and driving units for the sub-pixels of third color are arranged along a third column in the first direction, wherein the first column, the second column and the third column are staggered in a second direction.

12. The display panel according to claim 8, wherein the display panel is an organic light emitting diode display panel.

13. The display panel according to claim 8, wherein the display panel is a quantum dot light emitting diode display panel.

14. The display panel according to claim 8, wherein the display panel is a sub-millimeter light emitting diode display panel or a micrometer light emitting diode display panel.

15. A display device comprising the display panel according to claim 8.

16. A method for manufacturing the display panel according to claim 8, comprising depositing a continuous light emitting material layer for the same color through a mask with staggered openings.

17. The method according to claim 16, wherein light emitting material layers for different colors are deposited through masks with different opening sizes and/or different opening intervals.

18. The display panel according to claim 8, wherein in the first direction, a distance between adjacent pixels is in a range from 10 to 35 μm.

19. The display panel according to claim 8, wherein in at least one pixel, the first region has a light emitting area different from that of the second region, or the first sub-region has a light emitting area different from that of the second sub-region.

*    *    *    *    *